(12) United States Patent
Leupold

(10) Patent No.: US 8,558,545 B2
(45) Date of Patent: Oct. 15, 2013

(54) INCREASING SPOIL EFFICIENCY

(75) Inventor: Jochen Leupold, Freiburg (DE)

(73) Assignee: Universitaetsklinikum Freiburg, Freiburg (DE)

( * ) Notice: Subject to any disclaimer, the term of this patent is extended or adjusted under 35 U.S.C. 154(b) by 386 days.

(21) Appl. No.: 12/929,597

(22) Filed: Feb. 3, 2011

(65) Prior Publication Data

US 2012/0074937 A1 Mar. 29, 2012

(30) Foreign Application Priority Data

Mar. 26, 2010 (EP) .................................... 10158005

(51) Int. Cl.
*G01V 3/00* (2006.01)

(52) U.S. Cl.
USPC .......................................... 324/307; 324/309

(58) Field of Classification Search
USPC .................... 324/307, 309, 312, 314; 600/410
See application file for complete search history.

(56) References Cited

U.S. PATENT DOCUMENTS

| 5,500,593 | A * | 3/1996 | Loncar et al. | 324/307 |
| 8,228,060 | B2 * | 7/2012 | Busse | 324/307 |
| 8,406,849 | B2 * | 3/2013 | Jeong et al. | 600/410 |

OTHER PUBLICATIONS

J.Leupold et al., "Increasing Spoiling Efficiency in RF-Spoiled Gradient Echo Sequences by Averaging of Phase-Cycle Adapted k-Spaces", Proc. Intl. Soc. Mag. Reson. Med., May 1, 2010.

W.Lin et al., "Improved Signal Spoiling in Fast Radial Gradient-Echo Imaging: Applied to Accurate T1 Mapping and Flip Angle Correction", Magnetic Resonance in Medicine, vol. 62, 2009, pp. 1185-1194.

V.Denolin et al., "New Insights Into the Mechanisms of Signal Formation in RF-Spoiled Gradient Echo Sequences", Magnetic Resonance in Medicine, vol. 54, 2005, pp. 937-954.

Zur, Q., Wood, M.L. and Neuring, L.J., Spoiling of transverse magnetization in steady-state sequences, Magn. Reson. Med., 1991. 21(2):pp. 251-263.

Sobol, W.T. and Gauntt, D.M. "On the stationary states in gradient echo imaging", Magn. Reson. Imaging, 1996. 6(2): pp. 384-398.

Scheffler, K.A. "A pictorial description of steady-states in rapid magnetic resonance imaging", Concepts in Magnetic Resonance, 1999. 11(5):pp. 291-304.

Denolin, V. Azizieh, C. and Metens, T., "New insights into the mechanisms of signal formation in RF-Spoiled gradient echo sequences", Magn. Reson. Med. 2005. 54(4): pp. 937-954.

(Continued)

*Primary Examiner* — Louis Arana
(74) *Attorney, Agent, or Firm* — Paul Vincent

(57) ABSTRACT

A method for operating a nuclear magnetic resonance imaging device, wherein a continuous sequence of radio-frequency (=RF) pulses are radiated onto a sample, $\Psi$ being the constant phase value for all magnetization vectors, and all magnetization vectors undergo a phase progression $F_n = n\Psi$ during the n-th sequence interval, wherein P is the number of RF pulses after which the phase angle of the magnetization vectors is repeated, wherein the total gradient moment in one or more directions in space having a value greater than 0, and consecutive pulses exhibit a constant repetition time TR, wherein, after radiation of one RF pulse, one k-space row is acquired. The method is characterized in that any one- or multi-dimensional arrangement of k-space rows is repeated identically N times, and signals from identical k-space rows are averaged or added. The method increases the efficiency of the gradient spoiling and thus the efficiency of artifact suppression.

4 Claims, 3 Drawing Sheets

(56) References Cited

OTHER PUBLICATIONS

Leupold, J. Hennig, J. and Scheffler, K., "Moment and direction of the spoiler gradient for effective artifact suppression in RF-spoiled gradient echo imaging", Magn. Reson. Med. 2008. 60(1):pp. 119-127.

Crawley, A.P., Wood M.L. and Henkelmann, R.M., "Elimination of transverse Coherences in FLASH MRI", Magn. Reson. Med. 1988. 8: pp. 248-260.

Griswold, M.A., Jakob, P.M., Heidemann, R.M. Nittka, M., Jellus, V. Wang, J., Kiefer, B. and Haase, A. "Generalized autocalibrating partially parallel acquisitions (GRAPPA)", Magn. Reson.Med., 2002, 47(6): pp. 1202-1210.

Pruessmann, K.P. Weiger, M. Scheidegger, M.B. and Boesiger, P., "SENSE: sensitivity encoding for fast MRI", Magn. Reson. Med., 1999. 42(5): pp. 952-962.

\* cited by examiner

US 8,558,545 B2

INCREASING SPOIL EFFICIENCY

This application claims Paris Convention priority of EP 10 158 005.8 filed Mar. 26, 2010 the complete disclosure of which is hereby incorporated by reference.

BACKGROUND OF THE INVENTION

The invention concerns a method for operating a nuclear magnetic resonance imaging device, wherein a continuous sequence of radio-frequency (=RF) pulses is radiated onto a sample, with Ψ being the constant phase value for all magnetization vectors, and all magnetization vectors undergo a phase progression $F_n = n\Psi$ during the n-th sequence interval, wherein P is the number of RF pulses after which the phase angle of the magnetization vectors is repeated, the total gradient moment in one or more directions in space having a value greater than 0, and consecutive pulses exhibit a constant repetition time TR, wherein, after radiation of one RF pulse, one k-space row is acquired.

Such a method is known from Zur, Y., Wood, M. L., and Neuringer, L. J., *Spoiling of transverse magnetization in steady-state sequences*. Magn Reson Med, 1991. 21(2): pp. 251-63.

A radio-frequency (RF) spoiled gradient echo sequence (hereinafter also referred to as FLASH) is defined by the following features (see Zur, Y., Wood, M. L., and Neuringer, L. J., *Spoiling of transverse magnetization in steady-state sequences*. Magn Reson Med, 1991. 21(2): pp. 251-63; Sobol, W. T. and Gauntt, D. M., *On the stationary states in gradient echo imaging*. Magn Reson Imaging, 1996. 6(2): pp. 384-98; Scheffler, K., *A pictorial description of steady-states in rapid magnetic resonance imaging*. Concepts In Magnetic Resonance, 1999. 11(5): pp. 291-304; Denolin, V., Azizieh, C., and Metens, T., *New insights into the mechanisms of signal formation in RF-Spoiled gradient echo sequences*. Magn Reson Med, 2005. 54(4): pp. 937-54; Leupold, J., Hennig, J., and Scheffler, K., *Moment and direction of the spoiler gradient for effective artifact suppression in RF-spoiled gradient echo imaging*. Magn Reson Med, 2008. 60(1): pp. 119-27):

- A continuous sequence of radio frequencies is radiated onto the sample (for example, a person), wherein consecutive pulses exhibit the constant repetition time TR.
- After the RF irradiation, magnetic field gradients are created, rendering the real space of interest equivalent to a positional frequency space whose inverse Fourier-transformed space is the k space of any dimension. An additional dimension that can be introduced to the acquisition is time t, whereby the k-t space is acquired.

After each RF pulse, one row of the k-t space is acquired, wherein one row representing a set of points that lie along a straight line in any direction in the k-t space. The signal acquired after an RF signal of the k-t space is termed "k-space row."

Each magnetization vector $M(\theta) = (M_x, M_y, M_z)$ undergoes a phase progression $n \cdot \Psi$ during the n-th sequence interval, wherein n is the pulse number and Ψ is a constant phase angle (in degrees or rad), the "spoil increment" (Sobol, W. T. and Gauntt, D. M., *On the stationary states in gradient echo imaging*. Magn Reson Imaging, 1996. 6(2): pp. 384-98). Between the transverse magnetization vectors $M_n^+(\theta) = M_{x,n}^+ + iM_{y,n}^+$ directly after pulse no. n and $M_{n+1}^-(\theta) = M_{x,n+1}^- + iM_{y,n+1}^-$ directly before pulse no. n+1, the relation $M_{n+1}^-(\theta) = M_n^+(\theta)e^{in\Psi}$ therefore applies.

This phase progression is usually realized by applying a phase $\phi_n = n(n-1)\Psi/2$ to the RF pulses.

during one sequence cycle of duration TR, the total gradient moment $$m_{tot} = \int_{t'}^{t'+TR} G(t)\,dt \qquad \{1\}$$

(G(t)=is the progression over time of the gradient, t'=is any selected point in time during a repetition interval) exhibits a value greater than zero in one or more directions in space ("spoiler gradient"), so that before the following RF pulse starts, magnetization in one voxel along the direction of the spoiler gradient exhibits a varying phase angle. The sum of all magnetization vectors in a single voxel prevents artifacts caused by the varying RF pulse phase angle (Leupold, J., Hennig, J., and Scheffler, K., *Moment and direction of the spoiler gradient for effective artifact suppression in RF-spoiled gradient echo imaging*. Magn Reson Med, 2008. 60(1): pp. 119-27).

RF-spoiled gradient echo sequences were developed because the resulting images show a pure T1 contrast if a suitable Ψ is selected (Zur, Y., Wood, M. L., and Neuringer, L. J., *Spoiling of transverse magnetization in steady-state sequences*. Magn Reson Med, 1991. 21(2): pp. 251-63; Scheffler, K., *A pictorial description of steady-states in rapid magnetic resonance imaging*. Concepts In Magnetic Resonance, 1999. 11(5): pp. 291-304).

After several sequence cycles the magnetization vector directly after the n+1-th RF pulse (Denolin, V., Azizieh, C., and Metens, T., *New insights into the mechanisms of signal formation in RF-Spoiled gradient echo sequences*. Magn Reson Med, 2005. 54(4): pp. 937-54; Crawley, A. P., Wood M. L., and Henkelmann, R. M., *Elimination of Transverse Coherences in FLASH MRI*. Magn Reson Med, 1988. 8: pp. 248-60) is $$M_{n+1}^+(\theta) = M_n^+(\theta + \Psi) \qquad \{2\}$$

where Ψ is the spoil increment of the RF pulse phase and θ the phase angle through which the individual magnetization vectors continue to move during TR due to the spoiler gradient. The totality of the magnetization vectors that are subject to the same angle θ then together constitute an isochromat. Equation {2} can be interpreted in such a way that after every RF pulse, the assignment of the magnetization vector of a particular isochromat to a specified profile M changes.

Moreover, the following applies $$M_{n+P}^+(\theta) = M_n^+(\theta + P\Psi) = M_n^+(\theta) \qquad \{3\}$$

when $$P \cdot \Psi = K \cdot \pi, \qquad \{4\}$$

applies,
wherein P and K are integers. P is the period (the number of RF pulses) after which the assignment of the magnetization profile to the individual isochromats is repeated.

The function for the magnetization vector is $2\pi$ periodic in θ and the following applies:

$$\int_{-\pi}^{\pi} M_n^+(\theta)\,d\theta = const. \qquad \{5\}$$

Because of the behavior according to {2} and {5}, the state that the FLASH signal enters is called the "pseudo steady state."

According to the amplitude G (in T/m) and the duration t of the spoiler gradient, a phase difference of the magnetization $$\Delta\theta = 2\pi \cdot \gamma \cdot s \cdot \int G(t)dt \quad \{6\}$$

exists after the end of the gradient over a segment s (γ being the gyromagnetic moment in Hz/T).

The "spoil moment" $m_{sp}$ of the spoiler gradient specifies which phase difference Δθ will occur along a voxel length x in the gradient direction:

$$m_{sp} = 2\pi \cdot \gamma \cdot x \cdot \int G(t)dt \quad \{7\}$$

If $m_{sp}$=2π, integral {5} thus runs along exactly one voxel and the signal from the voxel remains constant.

In this way, the ghost artifacts that would occur if spoil increment Ψ alone were applied, i.e. without spoiler gradient (i.e. $m_{sp}$=0), are suppressed. For adequate artifact suppression, however, $m_{sp}$=2π (or integer multiples thereof) need not necessarily apply; artifact suppression is guaranteed by a large spread of spoil moments, wherein there is no preferred direction for the spoiler gradient (Leupold, J., Hennig, J., and Scheffler, K., *Moment and direction of the spoiler gradient for effective artifact suppression in RF-spoiled gradient echo imaging*. Magn Reson Med, 2008. 60(1): pp. 119-27).

The object of this invention is to increase the efficiency of the gradient spoiling and thus the efficiency of artifact suppression.

SUMMARY OF THE INVENTION

This object is inventively achieved in way that is both surprisingly simple and effective in that any one- or multi-dimensional arrangement of k-space rows is repeated identically N times, and that signals from identical k-space rows are averaged or added.

Averaging or addition of identical k-space rows is performed N times, wherein the averaging for a specific k-space row is performed in such a way that the N assignments of one isochromat to function M(θ) according to Eq. 2 are equidistant within the interval [0,2π] with distance 2π/N, that is, for the magnetization for the q-th of the N identical k-space rows $$M^+_{kq}(\theta) = M^+_{k1}(\theta + p2\pi/N) \quad \{8\}$$

where q∈[1,N], p∈[0,N−1], p and q being integers. It is thereby not necessary that p=q.

In one variant of the inventive method, blocks of one or more RF pulses for which no k-space row has been acquired but for which the counter n continues to be incremented, are inserted before or between the RF pulses with subsequent acquisition of a k-space row. Such pulse blocks are also termed "dummy sequence cycles."

An especially advantageous variant of the inventive method is characterized in that two identical k-space rows are m·P+P/N RF pulses apart, wherein m is a natural number or 0, and P and N are chosen such that P/N yields a natural number.

In a further variant of the inventive method, the method is activated by means of computer-assisted control of the nuclear magnetic resonance imaging device.

The method can, for instance, be implemented in a computer program that controls the nuclear magnetic resonance imaging device and which the user can access via a (user) interface. This would make it possible for the user to set the parameters characterizing the method (spoil moment in all three spatial directions, spoil increment, number of average value calculations, k-space rows per average value calculation) via the interface.

Moreover, it would be possible to offer the user automatic adaptation of the parameters characterizing the method, which can be activated by switching them on/off via the user interface.

It is further advantageous if the total gradient moment is reduced by a factor of N by means of the computer-assisted control when the method is activated. This retains the artifact behavior of the acquisition without average value calculations and without a reduced spoiler gradient.

DESCRIPTION OF THE PREFERRED EMBODIMENT

Figure 1:
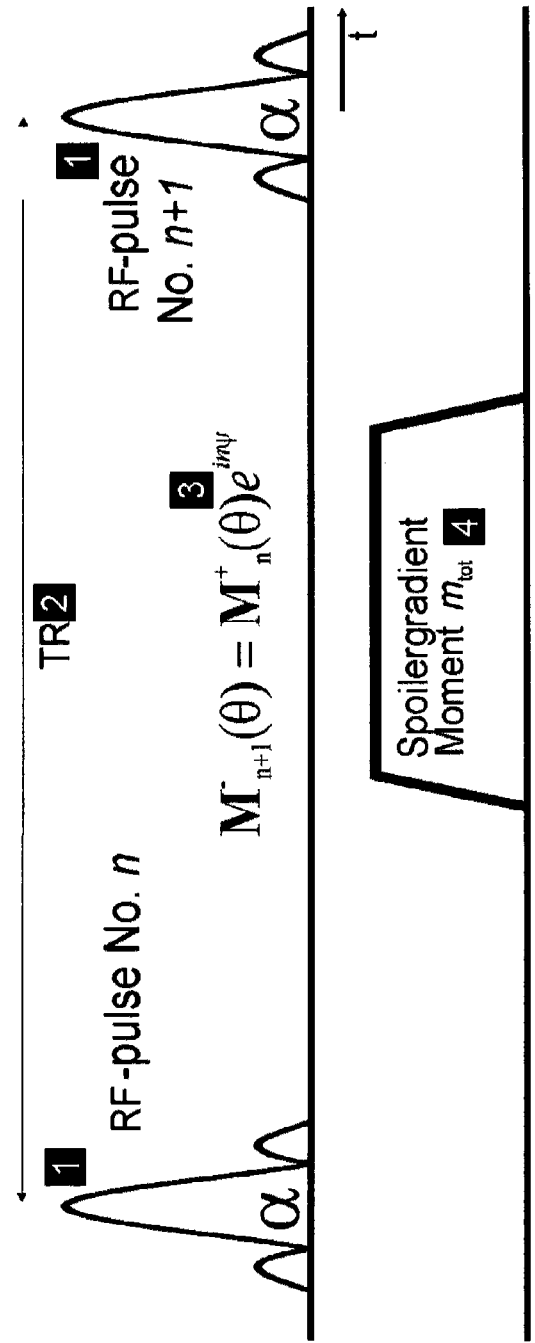
FIG. 1: Characterizing elements of an RF-spoiled gradient echo sequence according to the prior art.

A typical RF-spoiled gradient echo train is shown in FIG. 1. In the upper row, the RF pulses 1 are spaced at TR 2 with a flip angle α. Between the transverse magnetization vectors $M_n^+(\theta) = M_{x,n}^+ + iM_{y,n}^+$ directly after pulse no. n and $M_{n+1}^-(\theta) = M_{x,n+1}^- + iM_{y,n+1}^-$ directly before pulse no. n+1, the relation 3 $M_{n+1}^-(\theta) = M_n^+(\theta)e^{in\Psi}$ therefore applies.

In the lower row, spoiler gradient 4 with an arbitrary direction is displayed.

Figure 2:
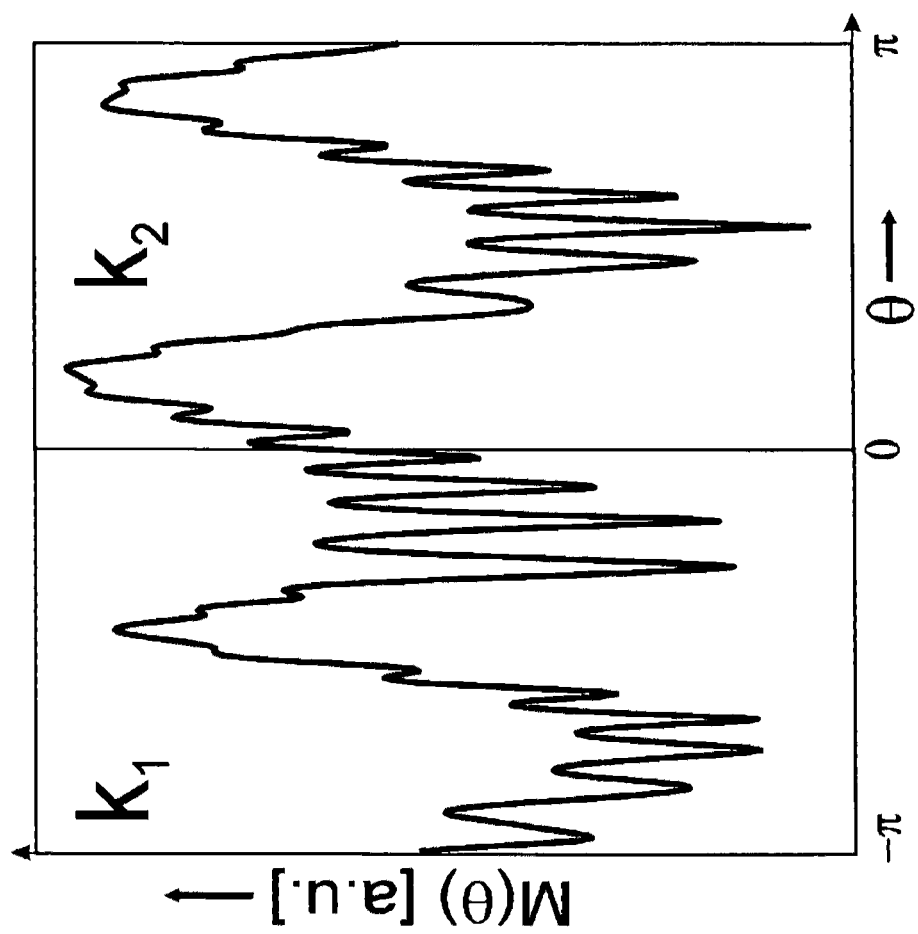
FIG. 2: Magnitude of the 2π-periodic magnetization M (θ) in the off-resonance angle θ in the pseudo steady state (after an arbitrary number of pulses)

The way the method works is described in more detail using the example N=2 (see FIG. 2). Let a common spoil increment Ψ=117°, that is, K=13 and P=40 be applied; let the spoil element be $m_{sp}$=π.

The following then applies according to the described method for adding the signals of two k-space rows $k_1$ and $k_2$ $$s_{k1}(m_{sp} = \pi) + s_{k2}(m_{sp} = \pi) = \int_{-\pi/2}^{\pi/2} M_n^+(\theta) d\theta + \int_{-\pi/2}^{\pi/2} M_n^+(\theta + \pi) d\theta = \quad \{9\}$$

$$2s_{k1}(m_{sp} = 2\pi) = 2\int_{-\pi}^{\pi} M_n^+(\theta) d\theta = \text{const.}$$

The voxel signal of a k-space row where $m_{sp}$=2π therefore corresponds to the addition of two identical k-space rows, each of which were acquired with half the spoil moment. Factor 2 in Eq. {9} is a weighting factor that takes into account that, in case of addition, each nucleus contributes N times to the added signal.

An image acquisition is now performed in the two-dimensional case, for example, in such a way that two k-spaces of m*P+P/N k-space rows are acquired consecutively. Any k-space trajectory can be used, but must be identical for both acquisitions. In the numerical example where m=5, P=40, N=2, the result is two k-spaces of 220 k-space rows each.

K-spaces of other dimensions can be averaged provided it can be guaranteed that identical k-space rows are n*P+P/N sequence cycles apart. In the simplest case, dummy sequence cycles can be run while no signal is acquired although magnetization still behaves according to Eq. {2}.

The image matrix displayed is independent of the number of k-space rows; any image matrix size can be achieved by interpolation.

Figure 3:
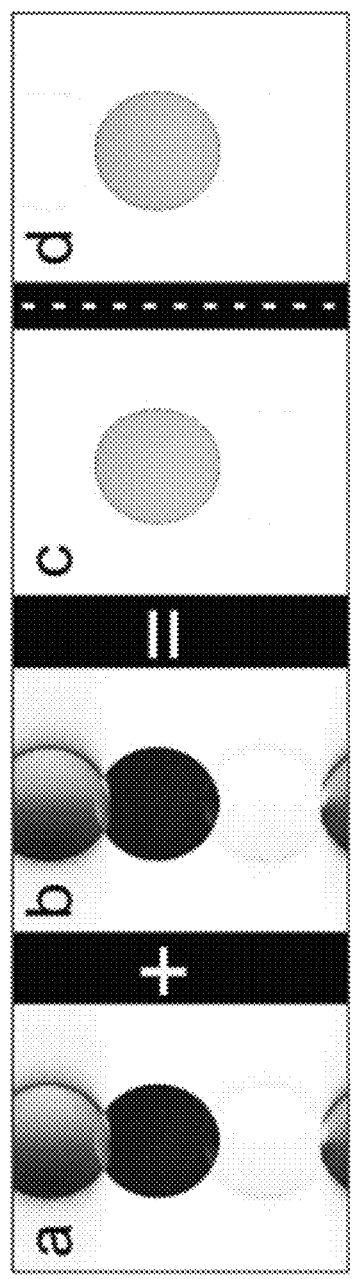
FIG. 3: Example, measured on a bottle phantom, Ψ=117°. a) Image of a k-space, acquired with $m_{sp}$=7 and 200 dummy sequence cycles before the acquisition. b) Image of a second k-space, $m_{sp}$=π, 220 dummy sequence cycles before the acquisition. c) Complex addition of both images from a and b. The intensity of the remaining ghost artifacts corresponds to those of a single acquisition d) where $m_{sp}$=2π.

One example measured with a bottle phantom at a field strength of 1.5 T, is shown in FIG. 3.

LIST OF REFERENCE SYMBOLS

1 RF pulse
2 Repetition time TR
3 Relation between the magnetization vectors
4 Spoiler gradient

REFERENCES

1. Zur, Y., Wood, M. L., and Neuringer, L. J., *Spoiling of transverse magnetization in steady-state sequences*. Magn Reson Med, 1991. 21(2): pp. 251-63.
2. Sobol, W. T. and Gauntt, D. M., *On the stationary states in gradient echo imaging*. Magn Reson Imaging, 1996. 6(2): pp. 384-98.
3. Scheffler, K., *A pictorial description of steady-states in rapid magnetic resonance imaging*. Concepts In Magnetic Resonance, 1999. 11(5): pp. 291-304.
4. Denolin, V., Azizieh, C., and Metens, T., *New insights into the mechanisms of signal formation in RF-Spoiled gradient echo sequences*. Magn Reson Med, 2005. 54(4): pp. 937-54.
5. Leupold, J., Hennig, J., and Scheffler, K., *Moment and direction of the spoiler gradient for effective artifact suppression in RF-spoiled gradient echo imaging*. Magn Reson Med, 2008. 60(1): pp. 119-27
6. Crawley, A. P., Wood M. L., and Henkelmann, R. M., *Elimination of Transverse Coherences in FLASH MRI*. Magn Reson Med, 1988. 8: pp. 248-60.
7. Griswold, M. A., Jakob, P. M., Heidemann, R. M., Nittka, M., Jellus, V., Wang, J., Kiefer, B., and Haase, A., *Generalized autocalibrating partially parallel acquisitions (GRAPPA)*. Magn Reson Med, 2002. 47(6): pp. 1202-10.
8. Pruessmann, K. P., Weiger, M., Scheidegger, M. B., and Boesiger, P., *SENSE: sensitivity encoding for fast MRI*. Magn Reson Med, 1999 42(5): pp. 952-62.

I claim:

1. A method for operating a nuclear magnetic resonance imaging device, the method comprising the steps of:
    a) applying an RF-spoiled gradient echo sequence in which a continuous sequence of radio-frequency (=RF) pulses are irradiated into a sample, wherein all magnetization vectors undergo a phase progression $F_n = n\Psi$ during an n-th sequence interval, wherein $\Psi$ is a constant phase value for all magnetization vectors, a phase angle of the magnetization vectors being repeated after P RF pulses, wherein a total gradient moment in one or more directions in space has a value greater than 0 and consecutive pulses exhibit a constant repetition time TR, a k-space row being acquired after irradiation of each RF pulse such that the sequence leads to acquisition of a plurality of k-space rows that build up a one dimensional or multidimensional arrangement of k-space rows;
    b) identically repeating any one- or mufti-dimensional arrangement of k-space rows N times; and
    c) averaging or adding signals from identical k-space rows such that two identical k-space rows are m·P+P/N RF pulses apart, m being a natural number or 0, and values for P and N are chosen such that P/N yields a natural number.
2. The method of claim 1, wherein blocks of one or more RF pulses for which no k-space row is acquired but for which the counter n continues to be incremented, are inserted before or between the RF pulses that are followed by acquisition of a k-space row.
3. The method of claim 1, wherein the method is activated by means of a computer-assisted control of the nuclear magnetic resonance imaging device.
4. The method of claim 1, wherein a total gradient moment is automatically reduced by the factor N when the method is activated by means of a computer-assisted control.

* * * * *